United States Patent [19]

Komoto et al.

[11] Patent Number: 4,854,377
[45] Date of Patent: Aug. 8, 1989

[54] LIQUID COOLING SYSTEM FOR INTEGRATED CIRCUIT CHIPS

[75] Inventors: Mitsuo Komoto; Youichi Matsuo; Toshifumi Sano, all of Tokyo, Japan

[73] Assignee: NEC Corporation, Japan

[21] Appl. No.: 931,847

[22] Filed: Nov. 18, 1986

[30] Foreign Application Priority Data

Nov. 19, 1985 [JP]  Japan ................. 60-257570
Nov. 19, 1985 [JP]  Japan ................. 60-257571
Nov. 19, 1985 [JP]  Japan ................. 60-257572

[51] Int. Cl.⁴ ..................... F28F 7/00; H05K 7/20
[52] U.S. Cl. ............................ 165/80.4; 165/185; 361/387
[58] Field of Search ............ 165/80.4, 185, 80.3; 361/386, 387, 388; 357/81

[56] References Cited

U.S. PATENT DOCUMENTS

| 4,072,188 | 2/1978 | Wilson et al. ............... 165/80.4 |
| 4,381,032 | 4/1983 | Cutchaw ...................... 165/185 X |
| 4,639,829 | 1/1987 | Ostergren et al. .......... 165/80.4 X |
| 4,649,990 | 3/1987 | Kurihara et al. ............ 165/80.4 |
| 4,685,211 | 8/1987 | Hagihara et al. ............ 165/80.4 |

OTHER PUBLICATIONS

IBM Tech. Disclosure Bulletin, "Heatsink design for cooling modules in a forced air environment," vol. 22, No. 6, No. 1979.
IBM Technical Disclosure Bulletin, "Method of Effective Cooling of a High Power Silicon Chip", vol. 20, No. 4 Sept. 1977.

Primary Examiner—Ira S. Lazarus
Assistant Examiner—Peggy Neils
Attorney, Agent, or Firm—Leydig, Voit & Mayer

[57] ABSTRACT

A cooling system for integrated circuit chips comprises a substrate, a plurality of integrated circuit chips mounted on a first surface of the substrate and a second surface opposite to the first surface thereof, a heat conductive means having a first surface and a second, flat surface opposite to the first surface, a layer of thermally conductive bonding material between the second surface of the substrate and the first surface of the heat conductive means, and a heat exchanger having a flat surface and provided with inlet and outlet means to permit liquid coolant to flow through the heat exchanger in contact with the flat surface. The heat exchanger is removably mounted to the heat conductive means with the flat surface thereof being in close proximity to the second surface of the heat conductive means. The thermally conductive bonding material allows a low thermal resistance contact to be made between the substrate and the heat conductive means and allows the latter to present a flat plane to the heat exchanger so that a low thermal resistance contact can also be established therebetween.

10 Claims, 4 Drawing Sheets

LIQUID COOLING SYSTEM FOR INTEGRATED CIRCUIT CHIPS

BACKGROUND OF THE INVENTION

The present invention relates to a liquid cooling system for integrated circuits.

A prior art cooling system for large scale integrated circuit chips as shown and described in U.S. Pat. No. 4,072,188 issued to E. A. Wilson et al involves the use of a liquid coolant heat exchanger having a flexible, heat conductive wall. The heat exchanger is mounted so that the flexible wall is in close proximity to a surface of the substrate on the other surface of which the integrated circuit chips are mounted. A low thermal impedance contact is made through the flexible wall of the heat exchanger between the substrate to be cooled and the coolant flowing through the heat exchanger because of the pressure of the coolant in the heat exchanger.

The flexible wall of the heat exchanger is formed of copper and has a thickness in the range between 0.05 mm and 0.25 mm. Because of the small thickness of the flexible wall, the pressure of the coolant in the heat exchanger reaches a limit which is unacceptably lower than is required to maintain the temperature of the integrated circuit chips in the micropackage below their maximum operating temperature. In addition, during replacement or repair greatest care must be taken to ensure against possible breakage of the thin flexible wall of the heat exchanger, which could lead to the leakage of liquid coolant to micropackages.

SUMMARY OF THE INVENTION

It is therefore an object of the present invention to provide a liquid cooling system for integrated circuit chips which is capable of maintaining their operating temperature below their maximum operating temperature and of ensuring against possible leakage of liquid coolant during replacement or repair of a micropackage.

Specifically, the present invention provides a cooling system which comprises a substrate having a first surface and a second surface opposite to the first surface; a plurality of integrated circuit chips mounted on the first surface of the substrate; a heat conductive member having a first surface and a second, flat surface opposite to the first surface, a layer of thermally conductive bonding material between the second surface of the substrate and the first surface of the heat conductive member for bonding the second surface of the substrate to the first surface of the heat conductive member; a heat exchanger having a flat surface and provided with an inlet and an outlet to permit liquid coolant to flow through the heat exchanger in contact with the flat surface and apparatus for removably mounting the heat exchanger to the heat conductive member with the flat surface of the heat exchanger being in close proximity to the second surface of the heat conductive member.

The present invention also provides a cooling system which comprises a panel; a connector mounted on the panel; a micropackage including a substrate having a first surface and a second surface opposite to the first surface and further including a plurality of integrated circuit chips mounted on the first surface of the substrate, the micropackage being removably mounted on the connector; a heat conductive member having a first surface and a second, flat surface opposite to the first surface; a layer of thermally conductive bonding material disposed between the second surface of the substrate and the first surface of the heat conductive member for bonding the second surface of the substrate to the first surface of the heat conductive member; a heat exchanger having a flat surface and provided with an inlet and an outlet to permit a liquid coolant to flow through the heat exchanger in contact with the flat surface of the heat exchanger; and apparatus for removably fastening the heat exchanger to the heat conductive member with the flat surface of the heat exchanger being in close proximity to the second surface of the heat conductive member.

The thermally conductive bonding material provides a low thermal resistance contact between the second surface of the substrate which may not be flat and the first surface of the heat conductive member and allows the second surface of the latter to present a flat plane to the heat exchanger so that a low thermal resistance contact is also made between them. Thus, heat generated by the integrated circuit chips is conducted efficiently to liquid coolant in the heat exchanger.

Preferably, the heat conductive member has a plurality of screw thread holes on the second surface thereof, and the heat exchanger has a plurality of throughbores in positions corresponding to the screw thread holes. A plurality of screws extend through the throughbores and are threadably engaged with the screw thread holes. The thermal resistance between the heat conductive member and the liquid coolant in the heat exchanger can be reduced in this way. During replacement or repair, the heat exchanger can be readily removed out of contact with the heat conductive means without the danger of leakage of liquid coolant because of the rigid structure of the heat exchanger.

In a preferred embodiment, the heat conductive member may comprise a solid member of heat conductive material having a plurality of parallel slits on one surface and a plurality of parallel slits on the other surface such that the slits on each surface are staggered relative to those on the other surface to permit the solid member to be divided into several segments each of which is screwed to the heat exchanger. This embodiment reduces the thermal resistance between the heat conductive member and the heat exchanger and allows the heat conductive member to be made of a low-cost material which may have a different thermal expansion coefficient from that of the substrate.

In a further preferred embodiment, the heat conductive member may comprise a plurality of heat conductive elements each having opposite first and second end faces, the first end faces of the heat conductive elements being secured to the substrate by means of the bonding material so that the second end faces lie on a common flat plane.

BRIEF DESCRIPTION OF THE DRAWINGS

The present invention will be described in further detail with reference to the accompanying drawings, in which.

DETAILED DESCRIPTION

Figure 1:
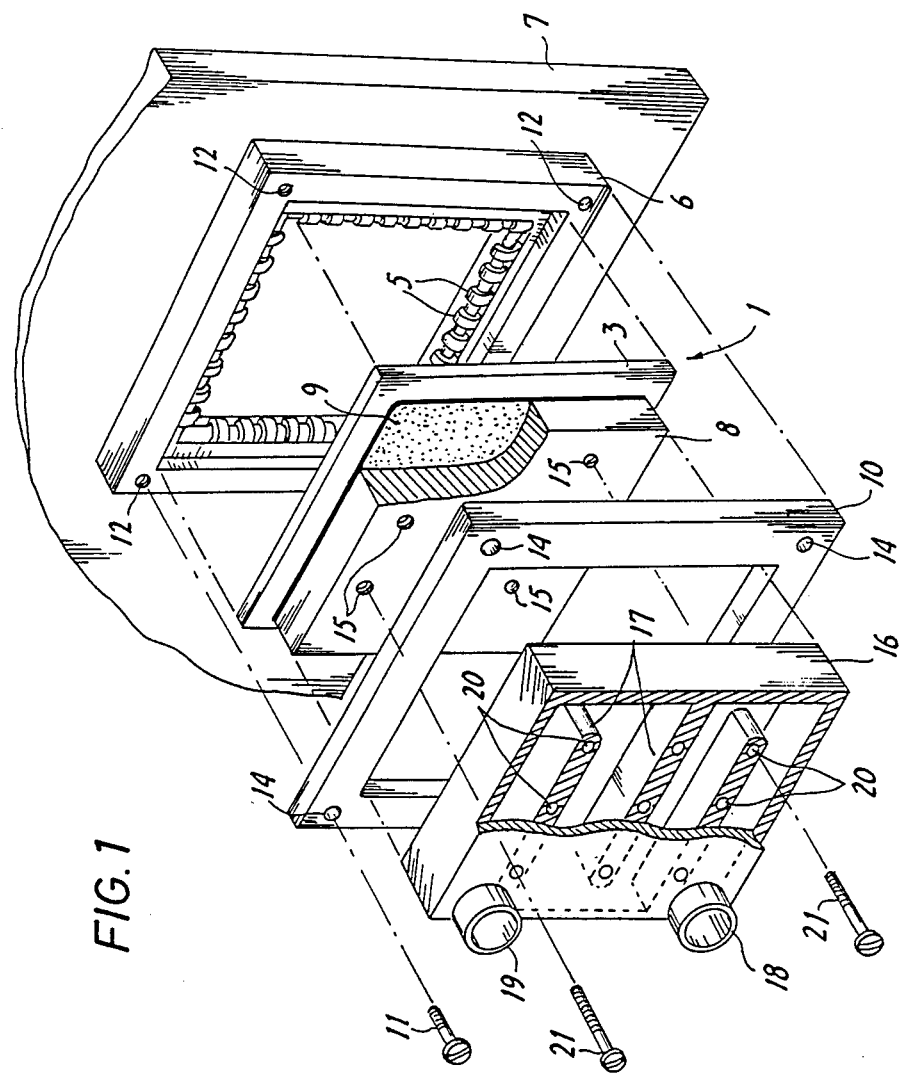
FIG. 1 is a perspective view of an embodiment of a liquid cooling system of the invention.
Figure 2:
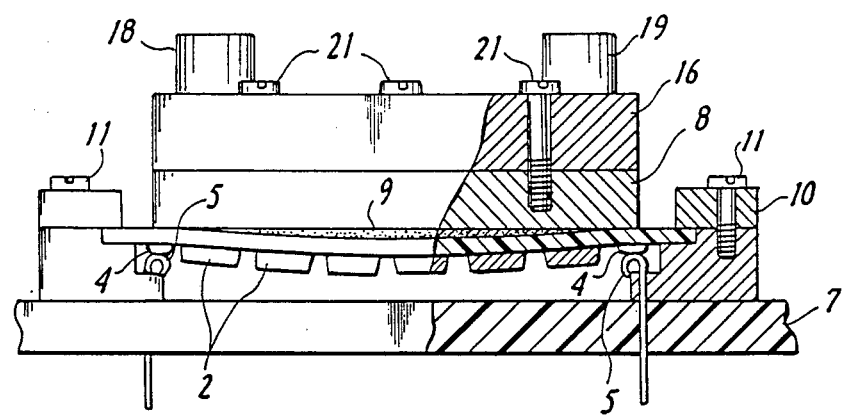
FIG. 2 is a view in section of the embodiment of FIG. 1.

Referring to FIGS. 1 and 2, there is illustrated a multichip integrated circuit assembly or micropackage 1 which comprises a relatively large number, approximately 80, of large scale integrated circuit chips 2 mounted on one surface of a square printed circuit board or substrate 3 which is made of electrically non-conductive ceramic material such as aluminum oxide. The chips and details of the printed circuit are not illustrated since they form no part of the invention. Along the edges of the substrate 3 is formed a plurality of electrical contacts 4 which engage contacts of connector 6. Connector 6 is fixedly mounted on a panel 7 which also has a printed circuit to permit the large scale integrated circuits 2 to be interconnected to form an electronic system.

To remove heat from micropackage 1 a square-shaped heat conductive member 8 is fixedly mounted on the substrate 3 opposite to integrated circuits 2 by means of a layer 9 of thermally conductive bonding material such as solder or silver-containing epoxy resin. If solder is used, the contact surface of substrate 3 should be metallized prior to soldering. Clearances between the heat conductive member 8 and substrate 3 due to the absence of flatness of the substrate 3 are filled with the thermally conductive bonding material 9. A low thermal resistance contact is thus established between the substrate 3 and heat conductive member 8. To maintain the heat conductive member 8 and substrate 3 in a fixed configuration under changing temperature, it is preferred that heat conductive member 8 have a thermal expansion coefficient substantially equal to the thermal expansion coefficient of substrate 3. Therefore, if the substrate 3 is formed of an aluminum oxide ceramic, the heat conductive member 8 comprises molybdenum and tungsten or a sintered block of a mixture of such material with particles of copper.

Micropackage 1 and heat conductive member 8 are held in fixed position by a mounting frame 10 which engages the periphery of substrate 3. Fastening means such as screws 11 threadably engage threaded holes 12 through holes 14 in cooperation with mounting frame 10 to removably hold the micropackage 1 in connector 6. The surface of heat conductive member 8 opposite to the micropackage 1 is flat and a plurality of threaded holes 15 are formed on it.

A water-cooling heat exchanger 16 has a plurality of partitions 17 which are arranged in a staggered pattern to form a meandering passageway between a water inlet 18 and an outlet 19. Partitions 17 are formed with throughholes 20 in one-to-one correspondence with threaded holes 15 of the heat conductive member 8. Heat exchanger 16 has a flat surface which is brought into low thermal resistance contact with the flat surface of heat conductive member 8 under pressure by means of screws 21 which extend through holes 20 and engage the threaded holes 15 of heat conductive member 8.

In operation, heat generated by integrated circuits 2 are conducted through the substrate 3, bonding layer 9 and heat conductive member 8 to the heat exchanger 16. Water is admitted through the inlet 18 to outlet 19 of heat exchanger 16 to transfer thermal energy from the heat conductive member 8 to cooling water. Since there is no air-filled interstices between the substrate 3 and heat conductive member 8, the deformation of substrate 3 due to heat is reduced to a minimum. In addition, since the heat conductive member 8 and heat exchanger 16 are in pressure contact by engagement with a plurality of screws 21, the thermal resistance between them is rendered smaller than the thermal resistance between the corresponding parts of the aforesaid prior United States patent. The total value of thermal resistances of the water cooling system between the integrated circuit chips 2 and heat exchanger 16 is therefore made significantly small. Since the heat exchanger 16 can operate under high liquid pressures, the liquid cooling system of the invention can operate at high efficiency.

When replacement or repair is required for micropackage 1, loosening of screws 21 allows the heat exchanger 16 to be removed from the heat conductive member 8 without the danger of water leakage, allowing the micropackage 1 with the heat conductive member 8 as a one-piece unit to be disconnected from connector 6 by loosening screws 11.

Figure 3:
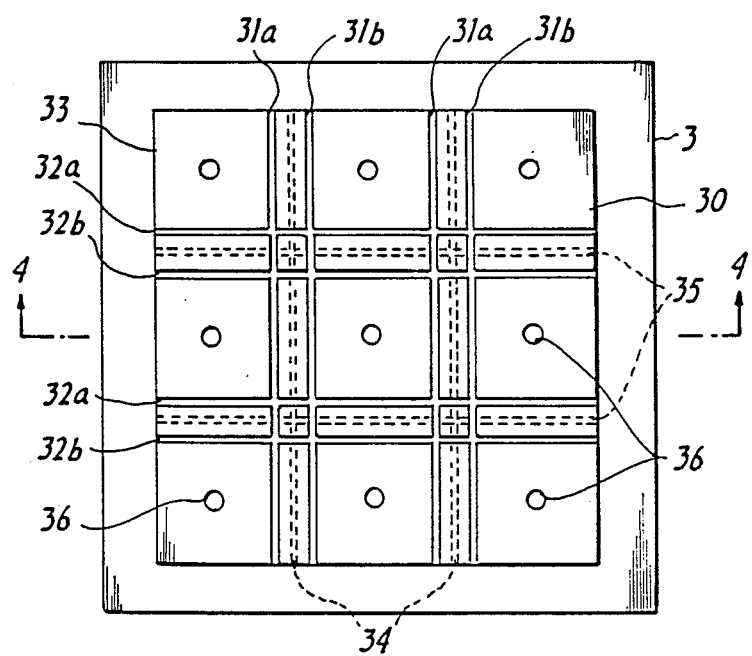
FIG. 3 is a plan view of a heat conductive member according to a second embodiment of the invention.
Figure 4:
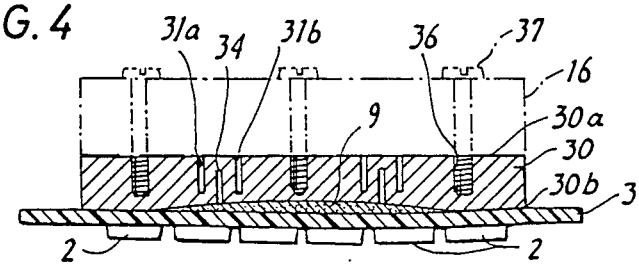
FIG. 4 is a cross-sectional view taken along the lines 4—4 of FIG. 3.

Heat conductive member 8 can be altered advantageously as shown at 30 in FIG. 3. Square-shaped heat conductive member 30 is formed of the same material as in the previous embodiment. Formed on a first surface 30a of the heat conductive member 30 are a plurality of parallel vertical slits 31a and 31b and a plurality of parallel horizontal slits 32a and 32b which intersect with vertical slits 31a and 31b to form segments 33. Further provided are screw thread holes 36 one for each of the segments 33. On a second, opposite surface 30b of the heat conductive member 30, parallel vertical slits 34 and parallel horizontal slits 35 are formed so that slits on one surface are staggered to a slit on the other surface as illustrated in FIG. 4. Heat conductive member 30 has its second surface 30b cemented to the substrate 3 with a layer of bonding material 9 as shown in FIG. 4. Heat exchanger 16 is removably mounted to the heat conductive member 30 by means of screws 37 which engage threaded holes 36. If the heat conductive member 30 is made of a material having a different thermal expansion coefficient than that of the substrate 3, the former will be subject to a bending force during the operation of the electronic system. However, the heat conductive member 30 is allowed to flex along the sets of staggered slits and so the bending force is divided into several components. Segments 33 are thus allowed to lie on different planes which are individually tilted with respect to the horizontal. Heat conductive member 30 will therefore have a smaller amount of deformation than would otherwise even if its thermal expansion coefficient differs from the substrate 3. A low-cost material which may differ in thermal expansion coefficient from the substrate can be employed advantageously for the heat conductive member 30. The individual engagement of segments 33 to heat exchanger 16 by screws 37 enables the heat conductive member 30 to be pressed hard against the flat contact surface of heat exchanger 16, further reducing the deformation of heat conductive member 30.

Figure 5:
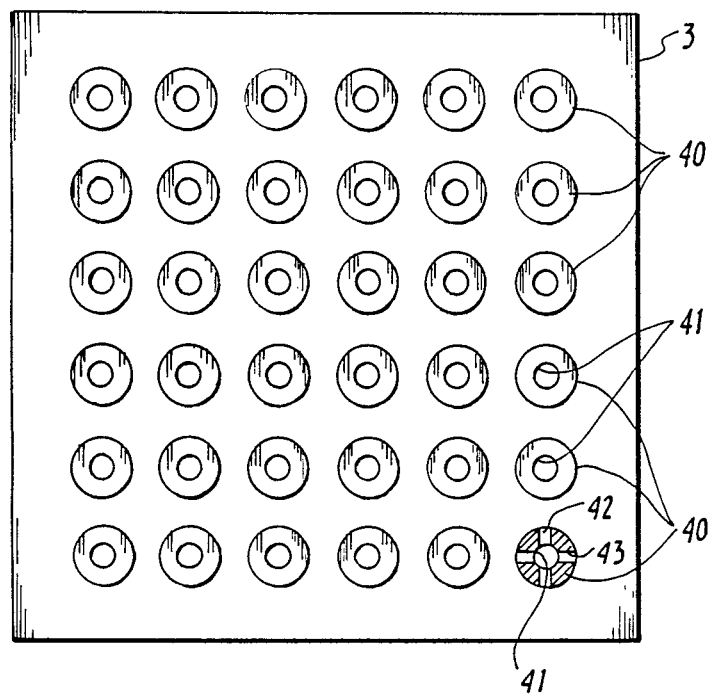
FIG. 5 is a plan view of heat conductive elements according to a third embodiment of the invention.
Figure 6:
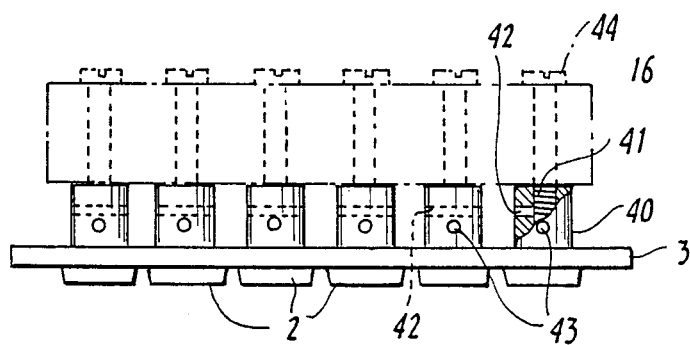
FIG. 6 is a view in elevation of the embodiment of FIG. 5.

Heat conductive member 8 can be modified in the form of a matrix array of heat conductive cylinders 40 one for each of the integrated circuit chips 2 as shown in FIGS. 5 and 6. Each of the heat conductive cylinders 40 is formed with an axially extending threaded hole 41, and a pair of orthogonally crossed holes 42 and 43 which extend through the threaded hole 41. Heat conductive cylinders 40 are cemented to the substrate 3 in a manner to be described below using the same bonding material (which is not shown in FIGS. 5 and 6) as used in the previous embodiments so that the ends of cylinders 40 opposite to the substrate 3 lie on a common flat plane with which the flat contact surface of heat exchanger 16 is under pressure contact with screws 44 which engage threaded holes 41.

Figure 7:
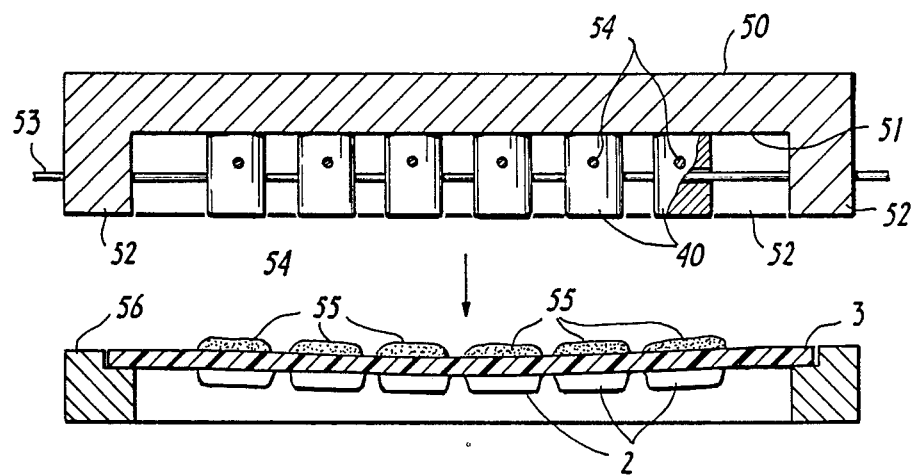
FIG. 7 is a view of jigs for aligning the heat conductive elements in an array of matrix and securing them to a substrate.
Figure 8:
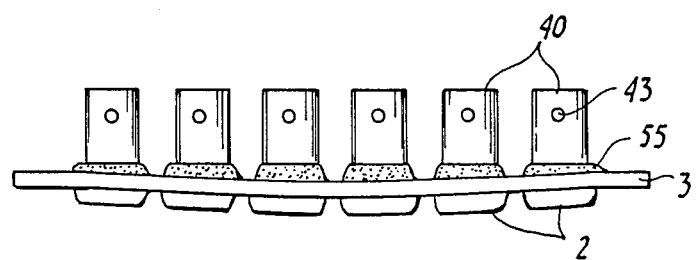
FIG. 8 is a view in elevation of the heat conductive elements assembled with the aid of the jigs of FIG. 7.

Referring to FIG. 7, an upper jig 50 has a flat surface 51 and two pairs of opposed side walls 52. Heat conductive cylinders 40 are arranged in a matrix array by orthogonally intersecting bars 53 and 54 which respectively extend through holes 42 and 43 and opposed side walls 52 of the jig 50 so that their upper ends come into contact with the flat surface 51. The bonding material is deposited on the substrate 3 in positions opposite to the heat conductive cylinders 40 as shown at 55. Substrate 3 is placed on a lower jig 56 which is brought into contact with the jig 50 so that the lower ends of cylinders 40 come into pressure contact with bonds 55. Under this condition, heat is applied to the assembly to cause the bonds 55 to secure the individual heat conductive cylinders 40 to the substrate 3. After the bonding materials are allowed to set, the cemented assembly is taken out of the jigs 50 and 56. Since the upper ends of cylinders 40 have been held under pressure against the flat surface 51 of upper jig 50 during the time the bonding materials are allowed to set, any deformation of the substrate 3 which may arise from the difference in thermal expansion coefficient between it and cylinders 40 is absorbed by bonds 55 as shown in FIG. 8 and so the upper ends of the cylinders lie on a common flat plane which is brought into pressure contact with the heat exchanger 16. It is preferred that the upper and lower jigs 50, 56 and bars 53 and 54 are made of a material having a thermal expansion coefficient substantially equal to that of the substrate 3 to ensure the flatness of the common plane presented by the upper ends of cylinders 40.

The foregoing description shows only preferred embodiments of the present invention. Various modifications are apparent to those skilled in the art without departing from the scope of the present invention which is only limited by the appended claims.

What is claimed is:

1. A cooling system for an electronic system comprising:
    a substrate having a first surface and a second surface opposite to the first surface;
    a plurality of integrated circuit chips mounted on the first surface of said substrate;
    a heat conductive means having a first surface and a second, flat surface opposite to the first surface;
    a layer of thermally conductive bonding material disposed between the second surface of said substrate and the first surface of said heat conductive means for bonding the second surface of said substrate to the first surface of said heat conductive means;
    a heat exchanger having a flat surface and provided with inlet and outlet means to permit liquid coolant to flow through said heat exchanger in contact with the flat surface of said heat exchanger; and
    mounting means for removably mounting said heat exchanger to said heat conductive means with said flat surface of said heat exchanger being in close proximity to said second surface of said heat conductive means.

2. A cooling system as claimed in claim 1, wherein said heat conductive means has a plurality of screw thread holes on said second surface thereof, and said heat exchanger has a plurality of throughbores in positions corresponding to said screw thread holes, wherein said mounting means comprises a plurality of screws extending through said throughbores and being threadably engaged with said screw thread holes.

3. A cooling system as claimed in claim 2, wherein said heat conductive means is formed with a plurality of first parallel slits on said first surface thereof and a plurality of second parallel slits on said second surface thereof, said second parallel slits being staggered relative to said first parallel slits so that said heat conductive means can be divided into a plurality of segments when said heat conductive means is subject to a bending force.

4. A cooling system as claimed in claim 2, wherein said heat conductive means comprises a plurality of heat conductive elements each having a first end face and a second end face opposite to the first end face, the first end faces of said heat conductive elements being cemented to said second surface of said substrate with said layer of thermally conductive bonding material and the second end faces of said heat conductive elements lying on a common flat plane which corresponds to said second, flat surface of said heat conductive means, each of said heat conductive elements having a screw thread hole on said second end face thereof for threadably engaging with said screws.

5. A cooling system as claimed in claim 4, wherein said heat conductive elements are provided in one-to-one correspondence to said integrated circuit chips.

6. A cooling system as claimed in claim 4, wherein said heat conductive elements are arranged in a matrix array.

7. A cooling system as claimed in claim 1, wherein said liquid coolant is water.

8. A cooling system for an electronic system comprising:
    a panel;
    a connector mounted on said panel;
    a micropackage including a substrate having a first surface and a second surface opposite to the first surface and further including a plurality of integrated circuit chips mounted on said first surface of the substrate, said micropackage being removably mounted on said connector;
    a heat conductive means having a first surface and a second, flat surface opposite to the first surface;
    a layer of thermally conductive bonding material disposed between said second surface of said substrate and said first surface of said heat conductive means for bonding the second surface of said heat conductive means for bonding the second surface of said substrate to the first surface of said heat conductive means;
    a heat exchanger having a flat surface and provided with inlet and outlet means to permit a liquid coolant to flow through said heat exchanger in contact with said flat surface of said heat exchanger; and
    means for removably fastening said heat exchanger to said heat conductive means with said flat surface of said heat exchanger being in close proximity to said second surface of said heat conductive means.

9. A cooling system as claimed in claim 8, wherein said heat conductive means has a plurality of screw thread holes on said second surface thereof, and said heat exchanger has a plurality of throughbores in positions corresponding to said screw thread holes, wherein said fastening means comprises a plurality of screws extending through said throughbores and being threadably engaged with said screw thread holes.

10. A cooling system as claimed in claim 8, wherein said heat conductive means comprises a plurality of heat conductive elements corresponding to said integrated circuit chips, each of said heat conductive elements being provided with a screw thread hole for engaging with a corresponding one of said screws.

* * * * *